(12) United States Patent
Zhe et al.

(10) Patent No.: US 7,202,552 B2
(45) Date of Patent: Apr. 10, 2007

(54) MEMS PACKAGE USING FLEXIBLE SUBSTRATES, AND METHOD THEREOF

(75) Inventors: Wang Zhe, Singapore (SG); Miao Yubo, Singapore (SG)

(73) Assignee: Silicon Matrix Pte. Ltd., Singapore (SG)

( * ) Notice: Subject to any disclaimer, the term of this patent is extended or adjusted under 35 U.S.C. 154(b) by 104 days.

(21) Appl. No.: 11/182,254

(22) Filed: Jul. 15, 2005

(65) Prior Publication Data

US 2007/0013036 A1   Jan. 18, 2007

(51) Int. Cl.
*H01L 23/552* (2006.01)

(52) U.S. Cl. .................. 257/659; 257/704; 257/710; 257/E23.193

(58) Field of Classification Search ........... 257/704, 257/710, 727
See application file for complete search history.

(56) References Cited

U.S. PATENT DOCUMENTS

| | | | | |
|---|---|---|---|---|
| 6,012,335 | A * | 1/2000 | Bashir et al. ............... | 73/724 |
| 6,300,679 | B1 * | 10/2001 | Mukerji et al. ............. | 257/738 |
| 6,667,480 | B2 * | 12/2003 | Kajiwara et al. ........... | 250/370.01 |
| 6,699,730 | B2 * | 3/2004 | Kim et al. ................... | 438/107 |
| 6,781,231 | B2 | 8/2004 | Minervini .................... | 257/704 |
| 6,998,704 | B2 * | 2/2006 | Yamazaki et al. ........... | 257/688 |
| 2002/0102004 | A1 | 8/2002 | Minervini .................... | 381/175 |
| 2004/0115920 | A1 * | 6/2004 | Yamazaki et al. ........... | 438/613 |
| 2005/0280138 | A1 * | 12/2005 | Shrivastava et al. ........ | 257/697 |
| 2006/0043562 | A1 * | 3/2006 | Watanabe .................... | 257/686 |

OTHER PUBLICATIONS

"The introduction of MEMS packaging technology", by C.T. Hsieh et al., *Proc of the 4th Int'l Symp. on Elec. Materials and Packaging*, Dec. 4-6, 2002, pp. 300-306.
"A new approach for opto-electronic/MEMS packaging" by R. Keusseyan et al., *Proc. of the 52nd Elec. Comp. and Tech. Conf.*, May 28-31, 2002, pp. 259-262.
"Considerations for MEMS packaging", Bige Wang, *Proc of the Sixth IEEE CPMT Conf. on High Density Microsystem Design and Packaging and Component Failure Analysis*, Jun. 30-Jul. 3, 2004, pp. 160-163.
Overview and development trends in the field of MEMS packaging, H. Reichle et al., The 14th IEEE Int'l Conf. on Micro Electro Mechanical Systems, Jan. 21-24, pp. 1-5.
"Challenges in the packaging of MEMS", by C.B. O'New et al., *Proc. of the Int'l Symp. on Advanced Packaging Materials: Processes, Properties and Interfaces*, Mar. 14-17, 1999, pp. 41-47.
PCT Patent Application PCT/SG2005/000034 filed on Feb. 8, 2005, "A Packaging Method for MEMS Devices, and MEMS Packages Produced Using the Method".

* cited by examiner

*Primary Examiner*—Leonardo Andujar
*Assistant Examiner*—Benjamin P. Sandvik
(74) *Attorney, Agent, or Firm*—Saile Ackerman LLC; Stephen B. Ackerman; Rosemary L. S. Pike

(57) ABSTRACT

A MEMS package and a method for its forming are described. The MEMS package has at least one MEMS device located on a flexible substrate. A metal structure surrounds the at least one MEMS device wherein a bottom surface of the metal structure is attached to the flexible substrate and wherein a portion of the flexible substrate is folded over a top surface of the metal structure and attached to the top surface of the metal structure thereby forming the MEMS package.

31 Claims, 11 Drawing Sheets

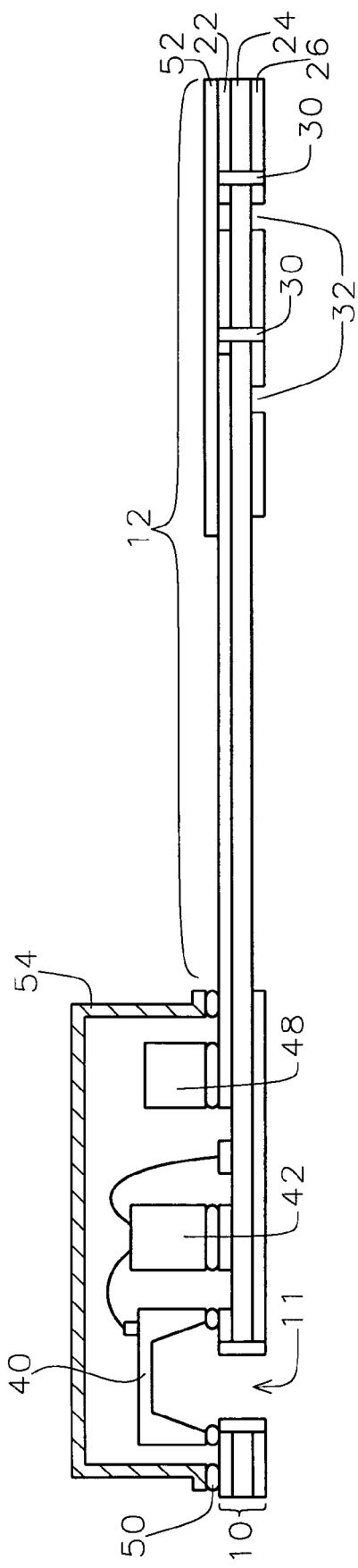
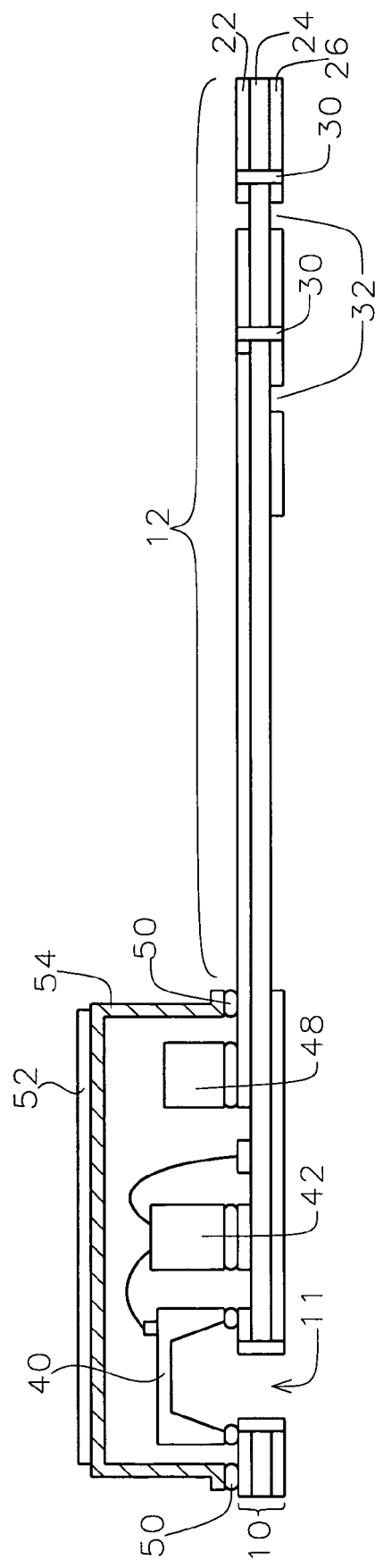
FIG. 3A
FIG. 3B

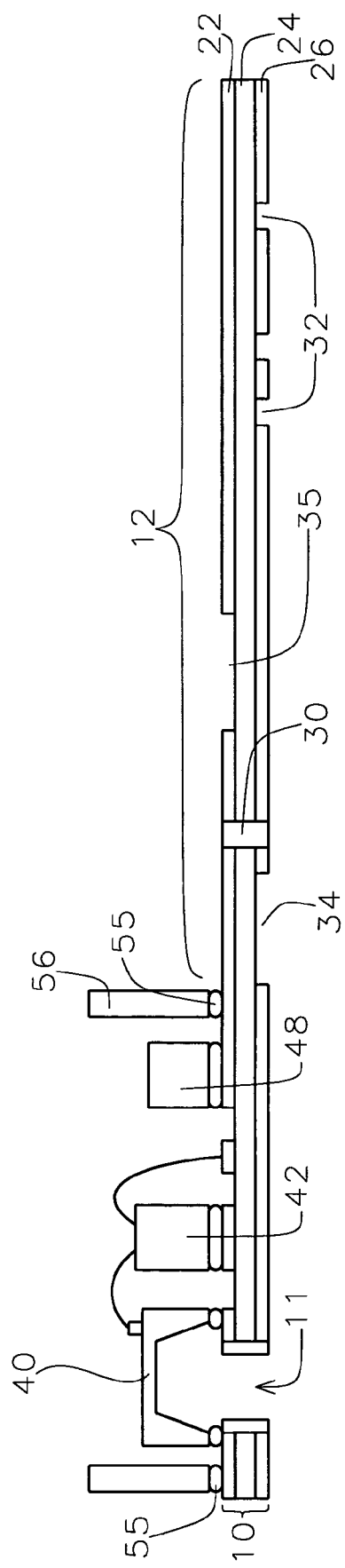
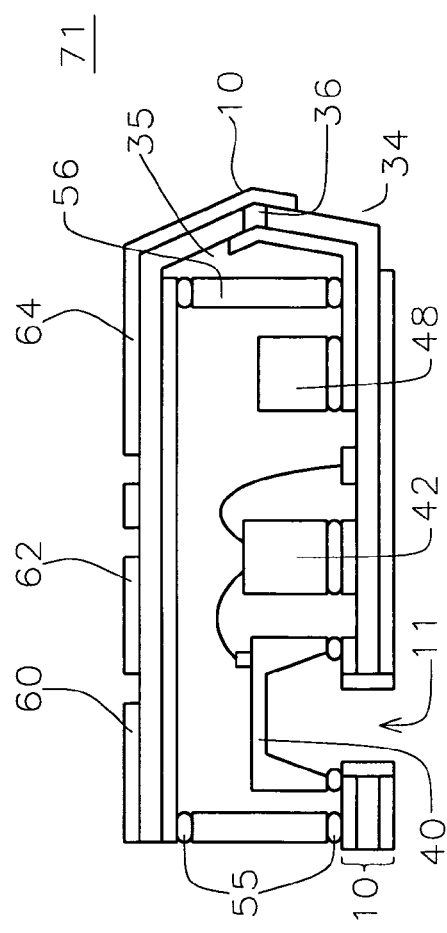
FIG. 9
FIG. 10

MEMS PACKAGE USING FLEXIBLE SUBSTRATES, AND METHOD THEREOF

BACKGROUND OF THE INVENTION (1) Field of the Invention

The invention relates to processes for packaging MEMS devices, and MEMS packages produced using the method, and more particularly, to a method of packaging MEMS devices using a flexible, foldable substrate.

(2) Description of the Related Art

Micro-electro-mechanical systems (MEMS) devices are known which convert physical phenomena, such as pressure, acceleration, sound, or light, into electrical signals. Each type of MEMS device interacts with the world in a different way, and demands custom or at least semi-custom packaging solutions. So-called system-in-package techniques attempt to form an entire microsystem—which could include a microprocessor, communications components, actuators and sensors—within a single package. However, packaging of a MEMS device is totally different from packaging an integrated circuit. MEMS devices are categorically different from ICs despite sharing some fundamental processing technologies. Packaging is the biggest challenge for commercializing most MEMS devices. The term "MEMS package" is used in this document to imply a package including at least one MEMS device.

A MEMS device might function perfectly well in the controlled environment in which it was created. However, the device can be a real viable product only after it has been packaged with proven performance in a package. For example, the packaging stress can distort the sensitivity and the performance of the MEMS devices. MEMS devices include delicate movable structures which are easily damaged through fabrication and assembly processes. As such, the assembly yield of a MEMS package is often a challenging target to meet.

The packaging requirements of MEMS devices are complex because the devices need to interact with the physical phenomenon and yet the devices need to be protected from the environment. As such, exotic package structures with specialized assembly techniques and unique packaging materials are employed for MEMS devices. Packaging is usually responsible for at least 60 percent of the cost of a MEMS device, and sometimes as much as 85 percent. Thus, it has been recognized that a low cost packaging solution with robust assembly is needed to promote the use of MEMS devices.

A variety of packages are known for packaging various MEMS products. "The introduction of MEMS packaging technology", by C. T. Hsieh et al, *Proceedings of the 4th International Symposium on Electronic Materials and Packaging*, 4–6 Dec. 2002, pp. 300–306, describes (for example with reference to its FIG. 3) various metal packages, such as TO8 (or round) headers, and butterfly and platform packages. Metal packages provide good heat dissipation capability and shielding of electrical radiation. The TO8 header is commonly fabricated from Kovar alloy to reduce the thermo-mismatch between the packaging material and the silicon etched devices.

"A new approach for opto-electronic/MEMS packaging" by R. Keusseyan et al, *Proceedings of the 52nd Electronic Components and Technology Conference*, 28–31 May 2002, pp. 259–262, describes (for example with reference to its FIG. 3) ceramic or LTCC packages. These are low cost, high reliability, gastight and multi-layer packaging architectures. An example of a ceramic package is an IR bolometer which is produced at high processing temperature in a vacuum seal environment.

"Challenges in the packaging of MEMS", by C. B. O'Neal, et al, *Proceedings of the International Symposium on Advanced Packaging Materials: Processes, Properties and Interfaces*, 14–17 Mar. 1999, pp. 41–47, compares (for example with reference to its FIG. 1) IC packages and MEMS pressure sensor packages. Plastic/lead frame packages are commonly employed in IC packaging and commonly classified as pre-molded and post-molded packages. The difference between pre-molded and post-molded packages is that pre-molded packages comprise a package body including a hollow cavity into which the IC is placed and then covered with a sealing cap, whereas in post-molded packages, the package body is molded over the assembly after the IC has been attached. Both these alternatives apply also to MEMS devices. For example, a post-molded package can be used for ICs or wafer capped accelerometers, while a pre-molded package can be used for a pressure sensor or microphone packaging. The plastic package offers a low cost packaging option. However, the required mold tooling is often expensive and time consuming, making it inflexible to meet fast changing needs from end-users' applications. Others key issues are that the plastic has very poor matching of thermal expansion with silicon and is also susceptible to moisture ingression.

Wafer level packaging (WLP) is a niche method for MEMS packaging. It involves an extra fabrication process where a micromachined wafer is bonded to a second wafer which has appropriate cavities etched into it. Once bonded, the second wafer creates a protective silicon cap over the micro-machine structure. This method leaves the microstructure free to move within a vacuum or an inert gas atmosphere. The bond is hermetic and therefore prevents moisture contamination and hence failure of the microstructure. WLP is discussed in "Considerations for MEMS packaging", Biye Wang, *Proceedings of the Sixth IEEE CPMT Conference on High Density Microsystem Design and Packaging and Component Failure Analysis*, 30 Jun.–3 Jul. 2004, pp. 160–163 and "Overview and development trends in the field of MEMS packaging", H. Reichl et al, *The 14th IEEE International Conference on Micro Electro Mechanical Systems*, 21–25 Jan. 2001, pp. 1–5.

U.S. Pat. No. 6,781,281 to Minervini and U.S. patent application Ser. No. 2002/0102004 A1 to Minervini discloses a MEMS microphone package in which a MEMS transducer element, an IC die and other capacitor components are located on a first multi-layer FR4 printed circuit board (PCB). A second multi-layer FR4 PCB is used as a cover. The two FR4 boards are spaced apart by a third FR4 board, which is cut to include a window which is placed around the components on the first PCB. Thus, the three PCBs cooperate to house and shield the transducer element, the IC die and other capacitor components. Compared with plastic/lead frame packages, such a package enables a larger batch operation, requires minimal hard tooling and has better match of thermal expansion with end user's PCB. Nevertheless, the mixing of the transducer element, the IC die and other electronic components on the same FR4 PCB substrate still presents difficulties in operating a high yield assembly process. Furthermore, a multi-layer FR4 PCB is not a cheap packaging material.

PCT patent application PCT/SG2005/000034 filed on 8 Feb. 2005 provides a method and package in which at least one MEMS device is mounted on a first flex substrate, and one or more electronic components are mounted on a second substrate. The two substrates are then joined mechanically in parallel with a spacer element between them and connected electrically by electrical connecting elements. The substrates sandwich the spacer element, the electrical connecting elements, the MEMS device and the one or more electronic components between them. The advantage of this method is that the process of mounting the MEMS device can be dealt with and performed separately from the process for mounting other IC and electronics components, thus making the assembly easier and higher yield. However, interconnecting the two substrates is a challenging task.

SUMMARY OF THE INVENTION

A principal object of the present invention is to provide an effective and very manufacturable method of producing a MEMS package incorporating a MEMS device and one or more other electronic circuits.

Another object of the invention is to provide a MEMS packages.

Yet another object of the invention is to provide a method of producing a MEMS package using a flexible and foldable substrate.

A further object of the invention is to provide a MEMS package including a flexible and foldable substrate.

A still further object is to provide a method of producing a MEMS package including a combination of a flexible and foldable substrate and a rigid substrate.

A still further object is to provide a MEMS package including a combination flexible and foldable substrate and a rigid substrate.

Yet another object is to provide a method of producing a MEMS package including a multiply folded flexible substrate.

Yet another object is to provide a MEMS package including a multiply folded flexible substrate.

In accordance with the objects of this invention a MEMS package is achieved. The MEMS package has at least one MEMS device located on a flexible substrate. A metal structure surrounds the at least one MEMS device wherein a bottom surface of the metal structure is attached to the flexible substrate and wherein the flexible substrate is folded over a top surface of the metal structure and attached to the top surface of the metal structure thereby forming the MEMS package. The metal structure can be in the form of a metal cap or a metal ring.

Also in accordance with the objects of this invention a method of producing a MEMS package is achieved. A least one MEMS device is mounted onto a flexible substrate. A bottom surface of a metal structure is attached to the flexible substrate surrounding the at least one MEMS device. The flexible substrate is folded over a top surface of the metal structure and attached to the top surface of the metal structure thereby forming the MEMS package.

Optionally, rigid portions of a rigid-flex substrate may be located over or under the flexible substrate in top and bottom portions of the package. Optionally, the flexible substrate may be folded from more than one side.

BRIEF DESCRIPTION OF THE DRAWINGS

In the accompanying drawings forming a material part of this description, there is shown:

FIGS. 3A and 3B schematically illustrate in cross-sectional representation two alternatives in the first preferred embodiment of the present invention.

FIGS. 6A, 7A, and 8 schematically illustrate in top view the front side of the flexible substrate of the invention. Also indicated in FIG. 6B and FIG. 8 are the cross sectional cutting lines F–F', based on which FIGS. 1–5 are drawn.

FIGS. 9 and 10 schematically illustrate in cross-sectional representation a second preferred embodiment of the present invention.

FIGS. 15 and 16 illustrate in top view the fourth preferred embodiment of the present invention. Also indicated in FIGS. 15 and 16 are the cross sectional cutting lines F–F', based on which FIGS. 14 and 17 are drawn.

FIG. 17 schematically illustrates in cross-sectional representation a fourth preferred embodiment of the present invention.

DESCRIPTION OF THE PREFERRED EMBODIMENTS

The present invention proposes a method for packaging a MEMS device as well as one or more electronic components (typically, an application specific IC (ASIC) and one or more passive components). The MEMS device and IC device are first assembled on a flexible substrate which has an elongated portion. The MEMS device is wirebonded directly to the IC device to minimize parasitic effects. A metal cap is applied to encapsulate the devices, or in the alternative, a metal ring surrounds the devices. The elongated portion of the flexible substrate is folded over the metal cap or ring and attached on the top of the metal cap or ring to complete the package. The metal cap or ring and the metal layer on the flexible substrate are electrically connected to form a Faraday cage for electromigration (EMI) and radio frequency (RF) shielding.

Figure 11:
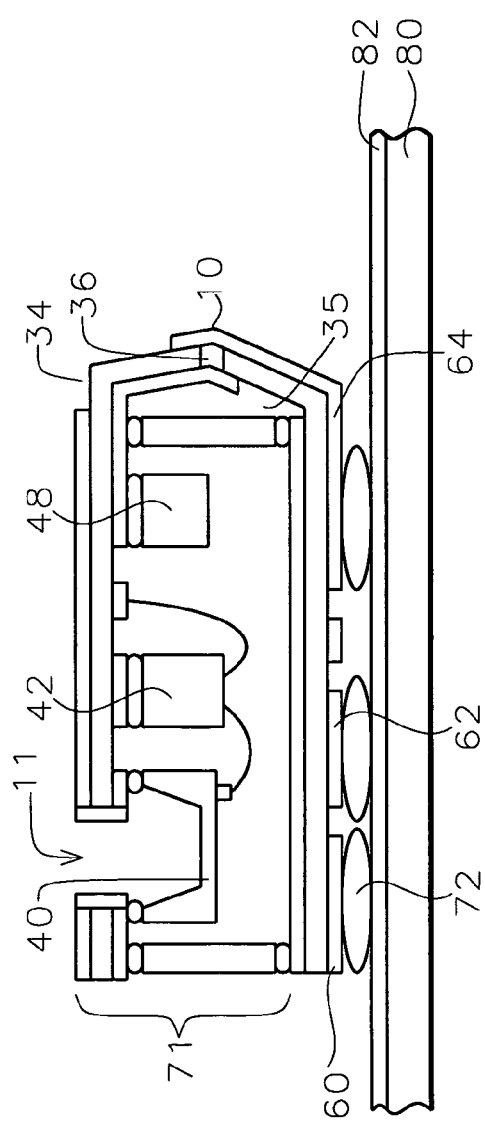
FIG. 11 schematically illustrates in cross-sectional representation surface mounting of the packaged MEMS device according to the second preferred embodiment of the present invention.
Figure 12:
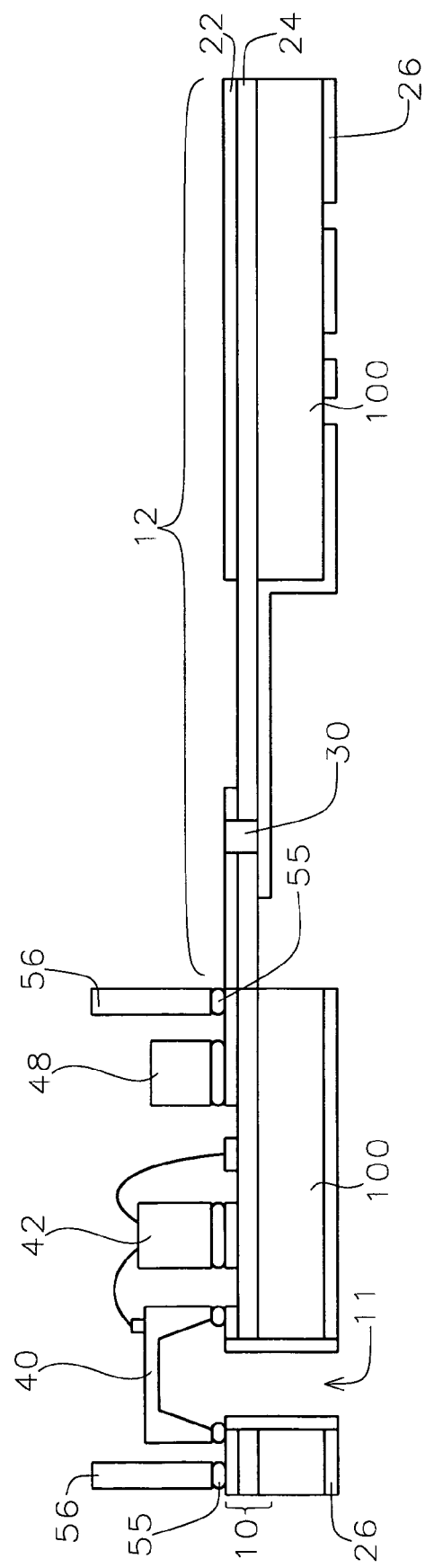
FIGS. 12 and 13 schematically illustrate in cross-sectional representation a third preferred embodiment of the present invention.
Figure 13:
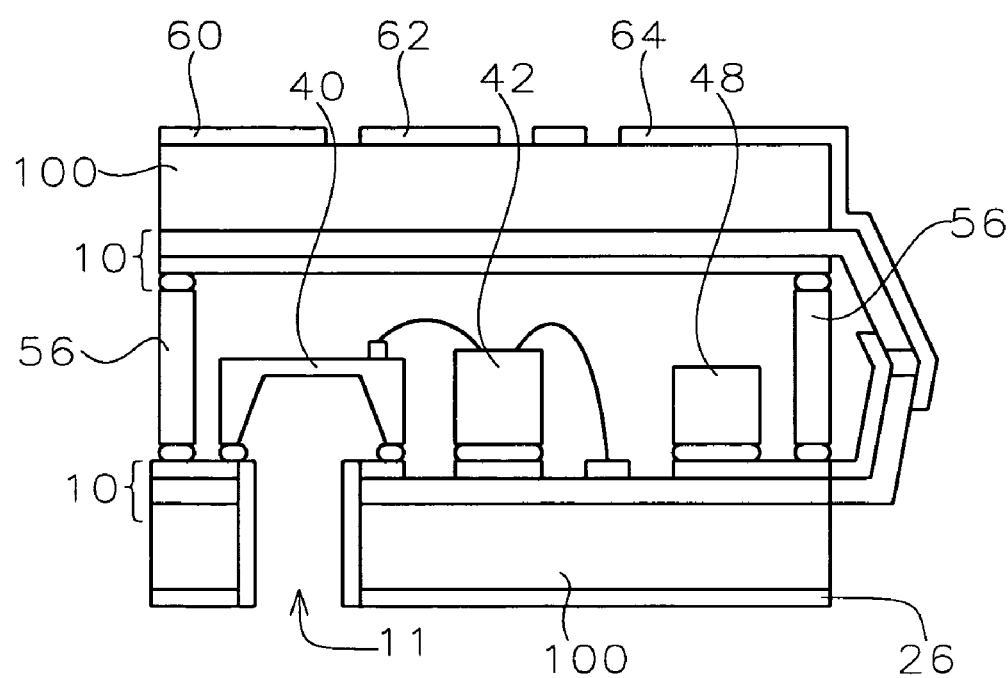

A first preferred embodiment of the invention is illustrated in FIGS. 1 through 8. A second preferred embodiment of the invention is illustrated in FIGS. 9–11. A third preferred embodiment of the invention is illustrated in FIGS. 12–13. A fourth preferred embodiment of the invention is illustrated in FIGS. 14–17. It will be understood by those skilled in the art that the invention should not be limited to the MEMS microphone device illustrated in the drawing figures, but that the invention can be applied to many other applications for packaging other types of MEMS device such as pressure sensors, accelerometers, gyroscopes, and so on, or other MEMS devices which may be proposed in the future.

Figure 1:
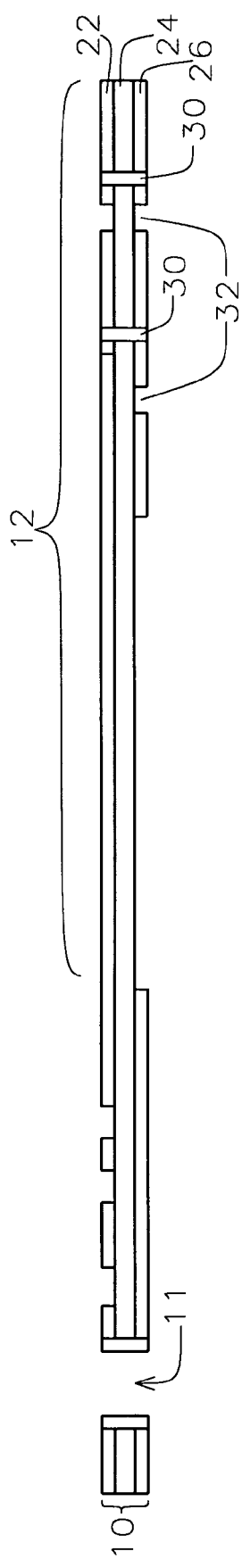
FIGS. 1 and 2 schematically illustrate in cross-sectional representation steps in a first preferred embodiment of the present invention.

The first embodiment of the invention will now be described with reference to FIGS. 1 through 8. Referring now more particularly to FIG. 1, there is illustrated a double metal layer (2ML) flexible substrate of the present invention. The flexible substrate 10 is formed of the core film layer 24 and copper metal layers 22 and 26 on both sides. The core film layer may be polyimide, polyethylene polyimide (PEI), poly tetra fluoro ethylene (PTFE), or liquid crystal polymer (LCP). ). Not shown in FIG. 1 is the solder resistive layer such as a coverlay or photosensitive epoxy which is patterned with exposures on wire bonding and electrical joining areas. This layer is shown in the top view in FIGS. 7A and 7B. The polyimide layer 24 is between about 12.5 and 100 μm in thickness. Such a core film of the flexible substrate 10 has a much lower modulus (typically 5 GPa) than a FR-4 printed circuit board (PCB) (typically 25 GPa), and so offers stress relaxation and minimizes the interaction of packaging stress or environmentally induced stress with a MEMS device mounted on it. The flexible substrate 10 includes an opening 11, known as an environmental hole. This may be a circular or square-shaped opening that allows external fluid, acoustic energy or pressure to interact with the MEMS device to be mounted thereover. The opening 11 also serves as a via hole connecting the metals on both sides. The flexible substrate 10 includes an elongated portion 12.

Metal layers 22 and 26 are joined to the top and bottom of the flexible core film layer 24 using adhesive or adhesiveless laminating techniques. Metal layers 22 and 26 are preferably copper, having a metal surface for wirebonding, such as soft gold. The copper layer is typically 25 μm in thickness, but can be more or less, depending on the application. The surface finish metal can be Ni/Au, where the nickel layer is about 3 μm thick and the overlying gold layer has a minimum thickness of about 0.35 μm.

Figure 6A:
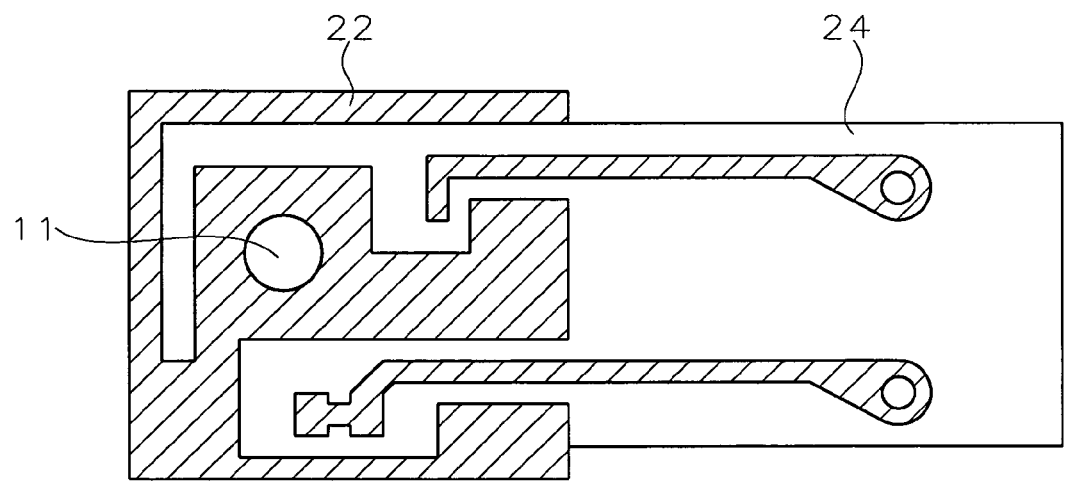
Figure 6B:
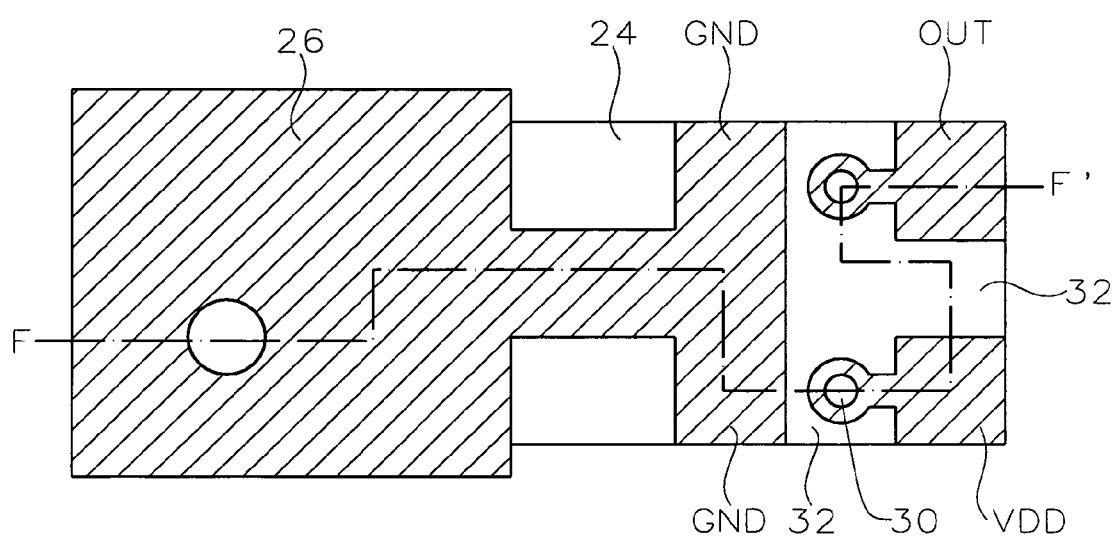
FIGS. 6B and 7B schematically illustrate in top view the back side of the flexible substrate of the invention.

FIG. 6A shows a top view of the top side of the flexible substrate 10. The top metal layer 22 has been formed and patterned on the polyimide material 24, as shown. Top metal layer 22 comprises copper with plated Ni/Au thereover. FIG. 6B shows a top view of the bottom side of the flexible substrate 10, showing bottom metal layer 26, also comprising copper with plated Ni/Au. The cross sectional figures follow line F–F' shown in FIG. 6B and FIG. 8.

Figure 7A:
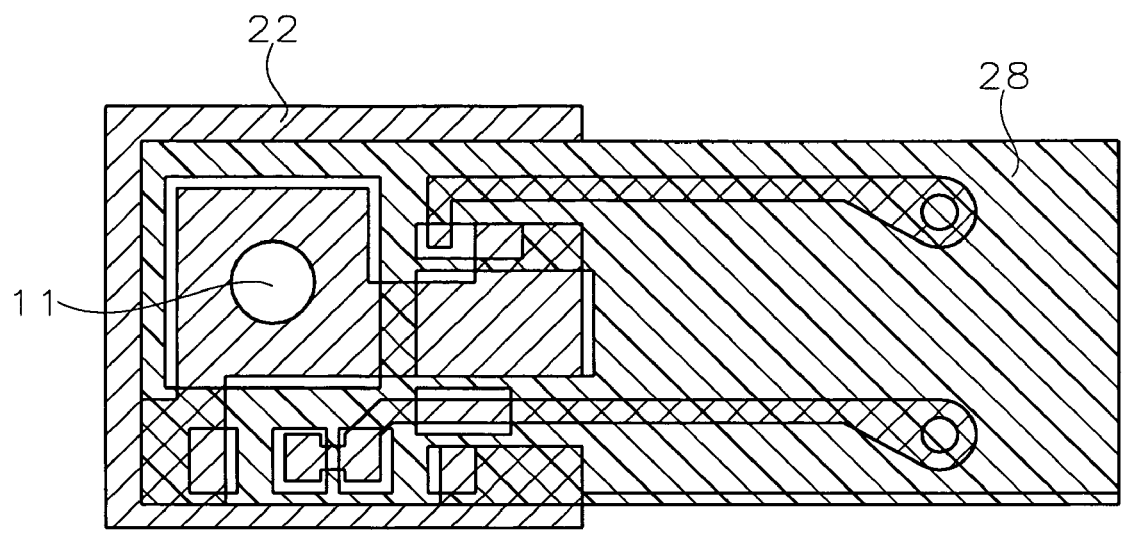
Figure 7B:
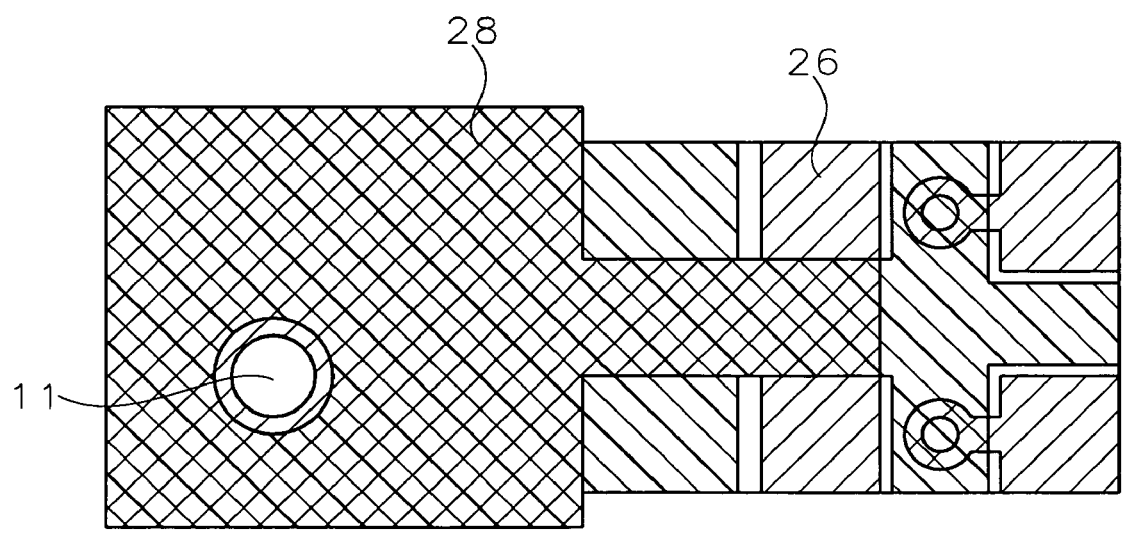

A solder mask or solder resist 28 is now formed on the metal surfaces 22 and 26. The patterned solder resist will prevent soldering on this area. The solder resist may be a coverlay or photosensitive epoxy and have a thickness of about 10–40 μm. The patterned solder resist is shown on the top side in FIG. 7A and on the bottom side in FIG. 7B. The patterned solder resist is not shown in the cross-sectional view, but it is understood to be there as shown in FIGS. 7A and 7B.

Referring again to FIG. 1, on the elongated portion 12 of the flexible substrate are formed vias 30, plated and plugged as interlayer interconnects, as shown in FIG. 6B. The vias will be connected to surface mount pads that are later connected to an external printed circuit board, for example, as described hereinafter. Openings 32 in the metal layer are also shown in FIGS. 1 and 6B. It is critical to the invention that the surface mount pads will be positioned on the opposite side of the package from the environment hole 11. Note that the hole 11 also serves as a via to interconnect layer 22 and layer 26.

Figure 2:
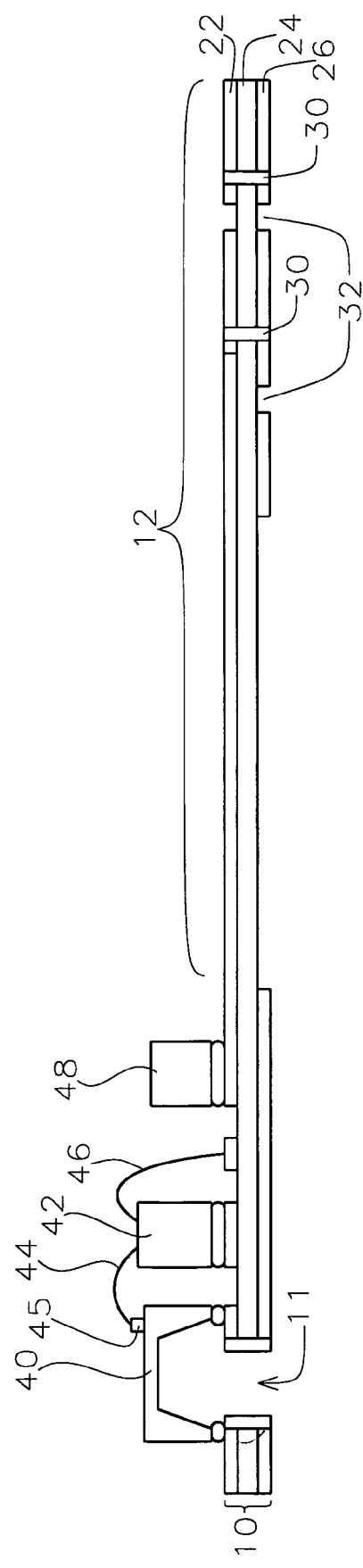

Referring now to FIG. 2, the passive components, the MEMS devices and the IC devices are mounted onto the flexible substrate 10. One MEMS device 40, one integrated circuit device 42, and one passive device 48 are illustrated.

Figure 8:
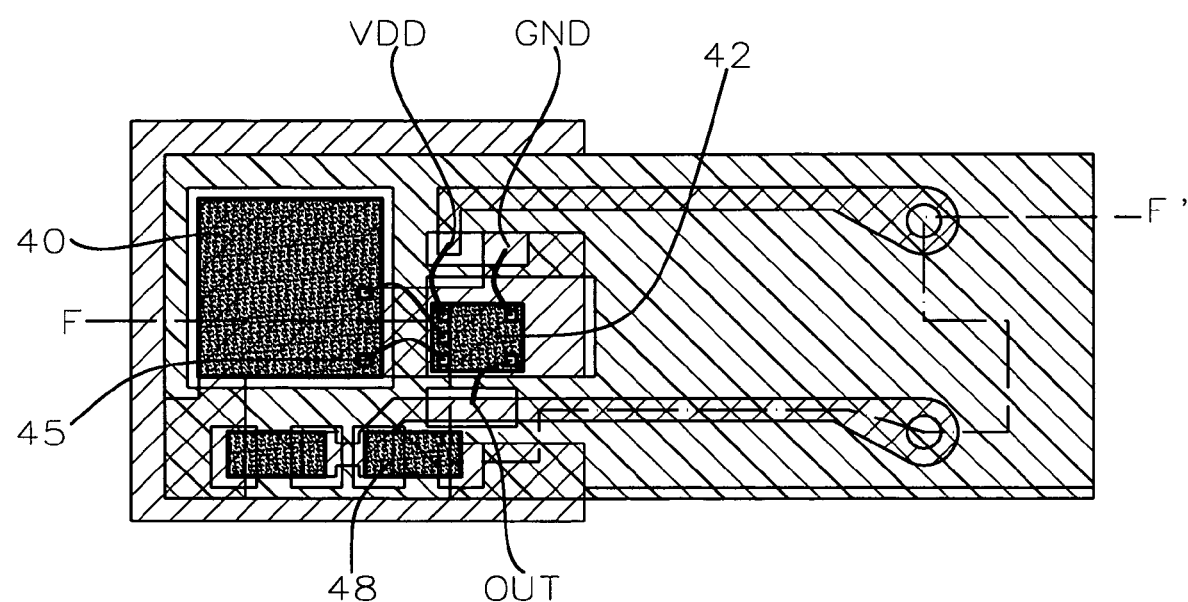

It will be understood that the MEMS package of the invention comprises at least one MEMS device, but that more than one MEMS device may be included. One or more electronic components, such as IC 42, typically, an application specific IC (ASIC) and one or more passive components such as a capacitor, resistor, inductor, or other passive device may be included in the package. FIG. 8 shows a top view of the flexible substrate with assembled components.

The MEMS device 40 is attached to the flexible substrate 10 with an adhesive 36. A low modulus adhesive would be preferred for stress relaxation such as a silicone based adhesive. Any IC device 42 is attached to the flexible substrate 10 using an adhesive in a die-attach process. Any passive device 48 is attached to the flexible substrate by a surface mounting technique (SMT). The IC device 42 is then wire-bonded by wires 44 and 46 to a bond pad 45 on the MEMS device 40 and to pad 47, respectively. For example, pad 47 may be for connection of the IC to VDD or OUT.

Now, as illustrated in FIG. 3A, an adhesive layer 52 is placed on the elongated portion 12 of the flexible substrate. The adhesive 52 may be a film, tape, or liquid paste. A metal cap 54 is attached to the flexible substrate by a conductive adhesive or solder 50. Alternatively, as shown in FIG. 3B, the metal cap 54 is attached to the flexible substrate by a conductive adhesive or solder 50. The adhesive layer 52 is placed on top of the metal cap 54. The metal cap may comprise copper, a copper alloy, an aluminum alloy, an iron alloy with solderable metal finish, a plastic with a metal finish formed by either electroless plating or painting, or a conductive composite formed by either injection molding or transfer molding. The metal cap 54 may be attached to the flexible substrate with a conductive adhesive, a solder (eutectic PbSn or any lead-free SnAg, SnAgCu), or a combination of a conductive adhesive or solder with a non-conductive adhesive. The soldering attachment may be done by using a solder reflow or hot bar method. The metal cap encapsulates all the devices on the flexible substrate. The metal cap 54 and the metal layer 26 on the flexible substrate 10 are electrically connected to form a Faraday cage for EMI/RF shielding.

Figure 4:
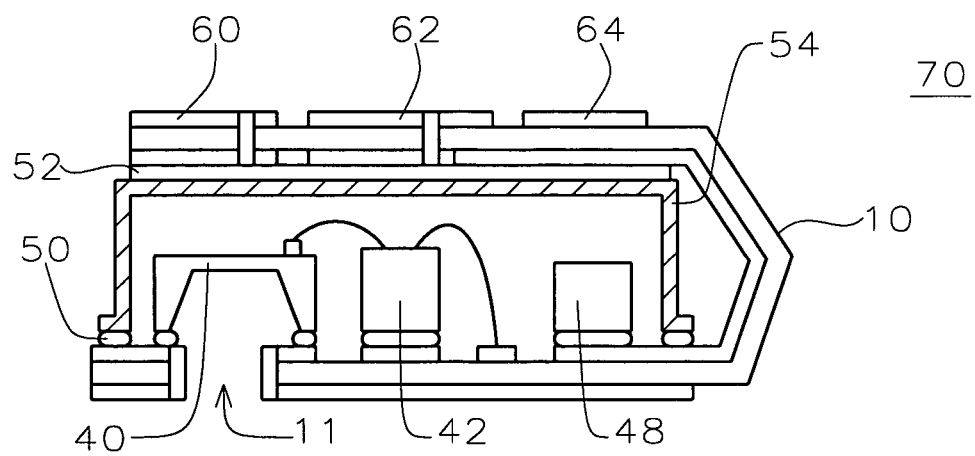
FIG. 4 schematically illustrates in cross-sectional representation another step in the first preferred embodiment of the present invention.

Referring now to FIG. 4, the elongated portion 12 of the flexible substrate 10 is folded over the metal cap 54 and attached to the metal cap by the adhesive 52. It can be seen that the OUT pad 60, VDD pad 62, and GND pad 64 are located on an opposite side of the package from the environment hole 11. This is important in the next step in which the packaged MEMS device is surface mounted to an application PCB, for example.

Figure 5:
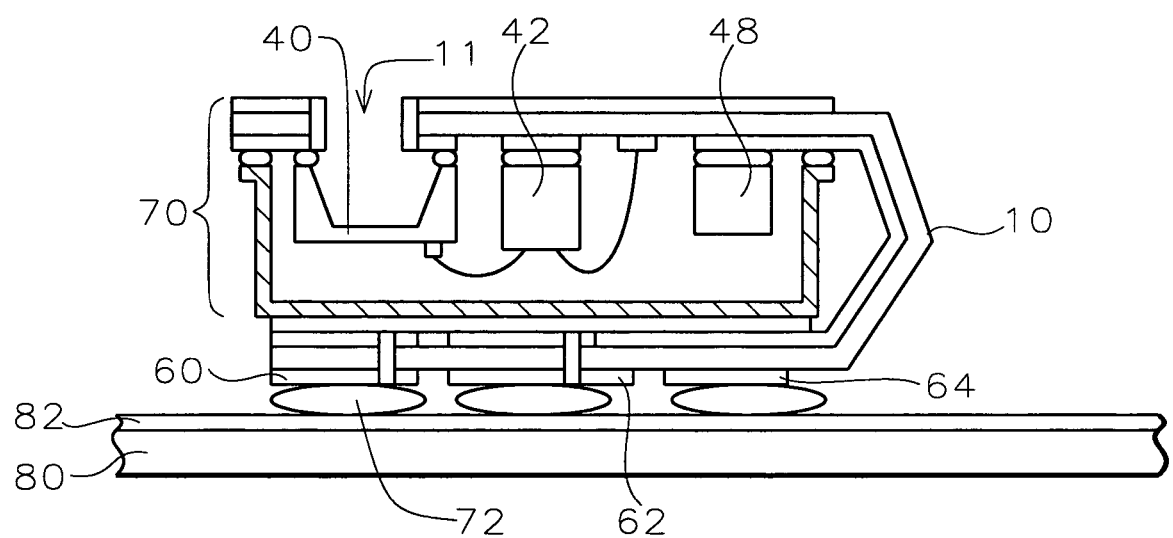
FIG. 5 schematically illustrates in cross-sectional representation surface mounting of the packaged MEMS device according to the first preferred embodiment of the present invention.

FIG. 5 illustrates the packaged MEMS device 70. An application PCB 80 is shown having pads 82 for connection with the MEMS package 70. The MEMS package 70 is surface mounted on the PCB 80 by solder bumps 72, for example. Flux generated by the solder reflow process would be detrimental to the MEMS device. Since the environment hole is located on the opposite side of the package 70 from the pads 60, 62, and 64, the flux will have much less chance to enter the environment hole to damage the MEMS device.

The second embodiment of the present invention will be described with reference to FIGS. 9–10. The second embodiment begins in the same way as illustrated in FIGS. 1 and 2. The MEMS devices and other electronic devices are mounted onto the flexible substrate 10.

Now, instead of the metal cap in FIG. 3, a metal ring 56 is placed on the flexible substrate 10 to surround the devices 40, 42, and 48. The metal ring 56 is attached to the flexible substrate with a conductive adhesive, a solder (eutectic PbSn or any lead-free SnAg, SnAgCu), or a combination of a conductive adhesive or solder with a non-conductive adhesive. The soldering attachment may be done by using a solder reflow or hot bar method.

Referring now to FIG. 10, the elongated portion 12 of the flexible substrate 10 is folded over the metal ring 56 and attached to the metal ring by an adhesive 55. Now, all vias are made in the sidewall to interconnect the electrical leadouts on the frontside metal 22 to the VDD and OUT pads on the backside metal layer 26. For simplicity of illustration, only via 36 and the openings on the metal layers 34 and 35 are shown.

It can be seen that the OUT pad 60, GND pad 62, and VDD pad 64 are located on an opposite side of the package from the environment hole 11. This is important in the next step in which the packaged MEMS device is surface mounted to an application PCB, for example. The metal ring 56 along with the metal layers 22 and 26 on the top and bottom of the flexible substrate are electrically connected to form a Faraday cage for EMI/RF shielding.

FIG. 11 illustrates the packaged MEMS device 71. An application PCB 80 is shown having pads 82 for connection with the MEMS package 71. The MEMS package 71 is surface mounted on the PCB 80 by solder bumps 72, for example. Flux generated by the solder reflow process would be detrimental to the MEMS device. Since the environment hole is located on the opposite side of the package 71 from the pads 60, 62, and 64, the flux will have much less chance to enter the environment hole to damage the MEMS device.

The package structure 70 or 71 of the present invention also offers further miniaturization feasibility. This is because its thickness in the z-axis (i.e. the up-down direction in FIGS. 4 and 10) is reduced by the use of the flexible substrate 10 which typically has a substrate thickness of about 0.1 mm or smaller.

The third embodiment of the invention will be described with reference to FIGS. 12–13. In this embodiment, a rigid substrate is combined with the flexible substrate of the invention. For example, a rigid FR-4 substrate is used. "FR" means Flame Retardant and Type "4" indicates woven glass reinforced epoxy resin. FIG. 12 illustrates rigid FR-4 layer 100 laminated to portions of the flexible substrate 10 underlying the components and at the portion of the substrate that will overlie the components after folding. FIG. 13 shows the package after folding. Metal ring 56 is shown. A metal cap could alternatively be used in this embodiment.

Figure 14:
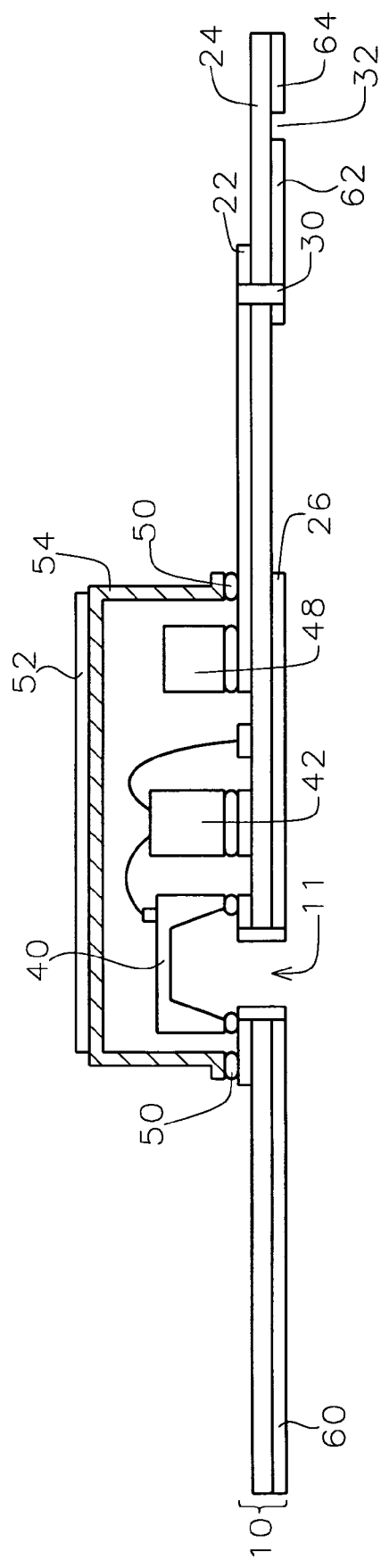
FIG. 14 schematically illustrates in cross-sectional representation a fourth preferred embodiment of the present invention.
Figure 15:
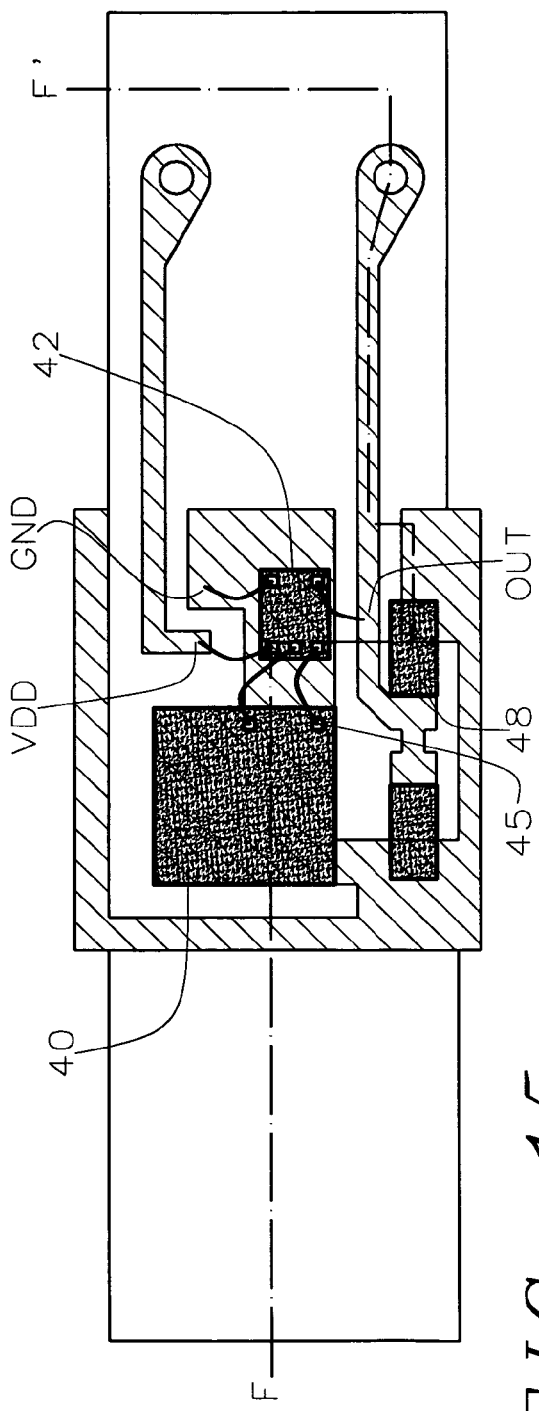
Figure 16:
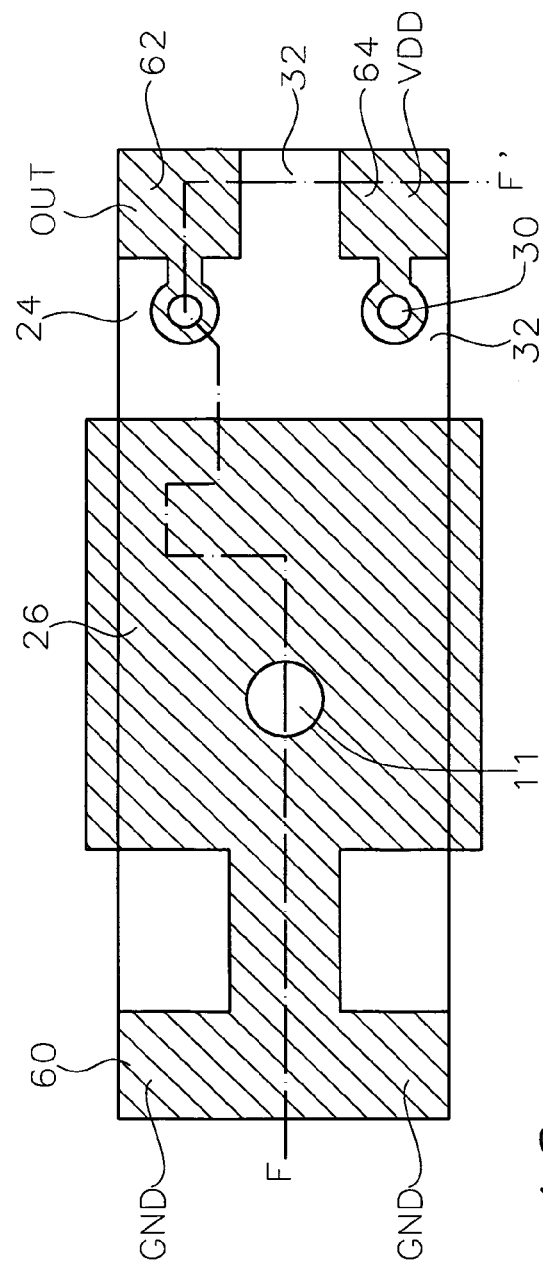
Figure 17:
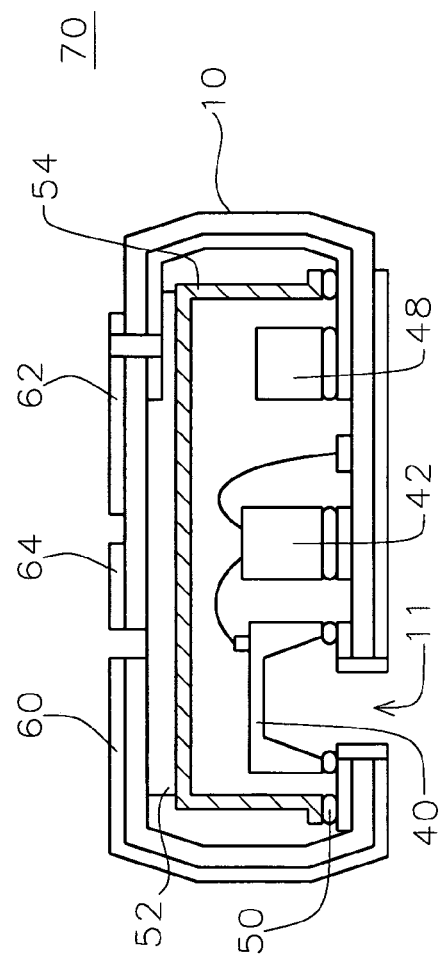

The fourth embodiment of the invention is illustrated in cross-section in FIGS. 14 and 17 and in top view in FIGS. 15 and 16. FIG. 15 shows the top view of the top side of the substrate and FIG. 16 shows the top view of the bottom side of the substrate. In this embodiment, the flexible substrate is folded at two sides. The metal cap or metal ring is used in this embodiment. FIG. 17 shows the package after folding.

The present invention provides MEMS packages using flexible substrates and methods of manufacturing these packages.

While the invention has been particularly shown and described with reference to the preferred embodiments thereof, it will be understood by those skilled in the art that various changes in form and details may be made without departing from the spirit and scope of the invention.

What is claimed is:

1. A MEMS package comprising:
   at least one MEMS device located on a flexible substrate; and
   a metal structure surrounding said at least one MEMS device wherein a bottom surface of said metal structure is attached to said flexible substrate and wherein said flexible substrate is folded over a top surface of said metal structure and attached to said top surface of said metal structure thereby forming said MEMS package.

2. The package according to claim 1 wherein said metal structure comprises copper, a copper alloy, an aluminum alloy, an iron alloy with solderable metal finish, a plastic with a metal finish formed by either electroless plating or painting, or a conductive composite material formed by either injection molding or transfer molding.

3. The package according to claim 1 wherein said flexible substrate comprises a core film with copper layers and solder resistive layers on both sides of said core film wherein said core film comprises polyimide, polyethylene polyimide, poly tetra fluoro ethylene, or liquid crystal polymer, and wherein said solder resistive layers comprise coverlay or photosensitive epoxy.

4. The package according to claim 1 wherein said metal structure comprises a metal ring surrounding said at least one MEMS device wherein said metal ring may comprise a copper, a copper alloy, an aluminum alloy, an iron alloy with solderable metal finish, a plastic with a metal finish formed by either electroless plating or painting, or a conductive composite material formed by either injection molding or transfer molding.

5. The package according to claim 4 wherein said flexible substrate further comprises a metal layer thereover and wherein said metal layer above and below said at least one MEMS device and said metal ring together provide EMI shielding of said at least one MEMS device.

6. The package according to claim 4 wherein said metal ring is attached to said flexible substrate by a conductive adhesive or a soldering material comprising eutectic PbSn or any lead-free SnAg or SnAgCu, or by a combination of a conductive adhesive or solder with a non-conductive adhesive.

7. The package according to claim 1 wherein said metal structure comprises a metal cap encapsulating said at least one MEMS device wherein said metal cap may comprise a copper, a copper alloy, an aluminum alloy, an iron alloy with solderable metal finish, a plastic with a metal finish formed by either electroless plating or painting, or a conductive composite material formed by either injection molding or transfer molding.

8. The package according to claim 7 wherein said flexible substrate further comprises a metal layer thereover and wherein said metal layer below said at least one MEMS device and said metal cap together provide EMI shielding of said at least one MEMS device.

9. The package according to claim 7 wherein said metal cap is attached to one portion of said flexible substrate at said bottom surface of said metal cap by a conductive adhesive, or soldering, or a combination of conductive adhesive or soldering and a non-conductive adhesive, or by a combination of a conductive adhesive or solder with a non-conductive adhesive.

10. The package according to claim 7 wherein said metal cap is attached to said flexible substrate at said top surface of said metal cap by an adhesive.

11. The package according to claim 1 further comprising one or more electronic components located on said flexible substrate and within said metal structure.

12. The package according to claim 11 further comprising wire bonding connections between said one or more electronic components and said at least one MEMS device.

13. The package according to claim 1 wherein said flexible substrate comprises an opening hole permitting interaction between said MEMS device and the environment outside said package wherein said opening hole also serves as a via connection for said metal layers on said flexible substrate.

14. The package according to claim 13 further comprising surface mount pads on an outer surface of said flexible substrate wherein said surface mount pads are located on an opposite side of said flexible substrate from said opening.

15. The package according to claim 1 wherein said flexible substrate further comprises a rigid layer laminated to a flexible layer wherein the folding portion is flexible and the other portions are rigid.

16. The package according to claim 15 wherein said rigid layer comprises a FR-4 layer.

17. The package according to claim 1 wherein said flexible substrate may be folded from at least one side to be attached to said metal structure.

18. A method for fabricating a MEMS package comprising:
mounting at least one MEMS device onto a flexible substrate;
attaching a bottom surface of a metal structure to said flexible substrate surrounding said at least one MEMS device; and
folding said flexible substrate over a top surface of said metal structure and attaching said flexible substrate to said top surface of said metal structure thereby forming said MEMS package.

19. The method according to claim 18 wherein said metal structure comprises a metal ring surrounding said at least one MEMS device and wherein said metal ring comprises copper, a copper alloy, an aluminum alloy, an iron alloy with solderable metal finish, a plastic with a metal finish formed by either electroless plating or painting, or a conductive composite material formed by either injection molding or transfer molding.

20. The method according to claim 19 wherein said flexible substrate comprises a core film and metal layers and wherein said metal layers above and below said at least one MEMS device and said metal ring together provide EMI shielding of said at least one MEMS device.

21. The method according to claim 18 wherein said metal structure comprises a metal cap encapsulating said at least one MEMS device wherein said metal cap comprises copper, a copper alloy, an aluminum alloy, an iron alloy with solderable metal finish, a plastic with a metal finish formed by either electroless plating or painting, or a conductive composite material formed by either injection molding or transfer molding.

22. The method according to claim 21 wherein said flexible substrate comprises a core film and a metal layer and wherein said metal layer below said at least one MEMS device and said metal cap together provide EMI shielding of said at least one MEMS device.

23. The method according to claim 18 wherein said flexible substrate comprises a top metal layer on a top surface of a flexible material and a bottom metal layer on a bottom surface of said flexible material.

24. The method according to claim 23 wherein said flexible material comprises polyimide, polyethylene polyimide, liquid crystal polymer, or poly tetra fluoro ethylene.

25. The method according to claim 23 wherein said top and bottom metal layers comprise copper plated with nickel and gold.

26. The method according to claim 23 further comprising forming a solder resist layer on surfaces of each of said top and bottom metal layers and patterning said solder resist layer, and said solder resist material comprises coverlay or photosensitive epoxy.

27. The method according to claim 18 further comprising mounting one or more electronic components on said flexible substrate and within said metal structure.

28. The method according to claim 18 after said folding said flexible substrate, further comprising:
providing surface mount pads on an outer surface of said flexible substrate opposite from said at least one MEMS device; and
attaching an application printed circuit board to said package at said surface mount pads.

29. The method according to claim 18 further comprising laminating a rigid layer to a flexible layer of said flexible substrate wherein the folding portion is flexible and the other portions are rigid.

30. The method according to claim 29 wherein said rigid layer comprises a FR-4 material.

31. The method according to claim 18 wherein said folding of said flexible substrate is made from at least one side to the top side of said metal structure.

* * * * *